United States Patent
Weber et al.

(10) Patent No.: US 7,335,256 B2
(45) Date of Patent: Feb. 26, 2008

(54) SILICON SINGLE CRYSTAL, AND PROCESS FOR PRODUCING IT

(75) Inventors: Martin Weber, Kastl (DE); Wilfried von Ammon, Hochburg (AT); Herbert Schmidt, Halsbach (DE); Janis Virbulis, Pinki, Babites Pag. (LV); Yuri Gelfgat, Jurmala (LV); Leonid Gorbunov, Riga (LV)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 11/487,669

(22) Filed: Jul. 17, 2006

(65) Prior Publication Data
US 2006/0254498 A1 Nov. 16, 2006

Related U.S. Application Data

(62) Division of application No. 10/732,119, filed on Dec. 10, 2003, now abandoned.

(30) Foreign Application Priority Data
Dec. 19, 2002 (DE) ................. 102 59 588

(51) Int. Cl.
*C30B 15/20* (2006.01)
(52) U.S. Cl. ................ 117/30; 117/32; 117/217; 117/917
(58) Field of Classification Search .......... 117/30, 117/32, 217, 218, 219, 222, 917
See application file for complete search history.

(56) References Cited

U.S. PATENT DOCUMENTS

| | | | |
|---|---|---|---|
| 5,690,731 A | 11/1997 | Kurata et al. | |
| 5,938,841 A * | 8/1999 | Kitagawa et al. | 117/200 |
| 5,968,264 A | 10/1999 | Iida et al. | |
| 6,153,008 A | 11/2000 | Von Ammon et al. | |
| 6,258,163 B1 * | 7/2001 | Kuragaki | 117/30 |
| 6,364,947 B1 | 4/2002 | Lida et al. | |
| 6,458,204 B1 * | 10/2002 | Okui et al. | 117/30 |
| 6,565,649 B2 | 5/2003 | Mule-Stagno et al. | |
| 6,663,708 B1 | 12/2003 | Morita et al. | |
| 2002/0092461 A1 | 7/2002 | Virbulis et al. | |

FOREIGN PATENT DOCUMENTS

| | | |
|---|---|---|
| DE | 19806045 | 8/1998 |
| EP | 0866150 | 6/2001 |
| EP | 1225255 | 7/2002 |
| JP | 62212290 | 9/1987 |

(Continued)

OTHER PUBLICATIONS

English Derwent Abstract AN 1998-458154 corres. to DE 19806045.

(Continued)

*Primary Examiner*—Felisa Hiteshew
(74) *Attorney, Agent, or Firm*—Brooks Kushman P.C.

(57) ABSTRACT

A silicon single crystal which, over an ingot length of over 10 percent of the total ingot length, has a uniform defect picture and narrow radial dopant and oxygen variations. The process in accordance with the Czochralski method involves bringing about a temperature distribution in the melt in the region of the solidification interface which deviates from rotational symmetry.

20 Claims, 7 Drawing Sheets

FOREIGN PATENT DOCUMENTS

| | | |
|---|---|---|
| JP | 1053485 | 3/1989 |
| JP | 09263485 | 10/1997 |
| JP | 11079889 | 3/1999 |
| JP | 2001019592 | 1/2001 |
| JP | 2002226294 | 8/2002 |

OTHER PUBLICATIONS

Patent Abstract of Japan corresponding to 62078184.

A.M. Eidenzon and N.I. Puzanov, "Defect-free Silicon Crystals Grown by the Czochralski Technique", Inorganic Materials, vol. 33, No. 3, 1997, pp. 219-225.

English Abstract of JP 09263485 A.

English Abstract of JP 10053485.

English Abstract of JP 2001019592.

English Abstract of JP 62212290.

* cited by examiner

SILICON SINGLE CRYSTAL, AND PROCESS FOR PRODUCING IT

This application is a division of and claims priority to U.S. patent application Ser. No. 10/732,119 filed Dec. 10, 2003 now abandoned, and also claims priority to German Application DE 102 59 588.7 filed Dec. 19, 2002.

BACKGROUND OF THE INVENTION

1. Field of the Invention

The present invention relates to a silicon single crystal and to a process for producing it, in which the single crystal is pulled from a melt using the Czochralski method. This method has long been known and is used on an industrial scale to produce semiconductor wafers which in turn form the base material for the fabrication of electronic components.

2. The Prior Art

It is also known that the production of single crystals which have a diameter of 200 mm or greater imposes particular demands. In particular, there are considerable difficulties with deliberately setting the radial crystal properties within the narrowest possible range. This is true in particular for the concentration of foreign substances or dopants and crystal defects or agglomerates thereof. The radial crystal properties are substantially determined by the thermal conditions at the solidification interface and the concentrations of substances which are present there. Heat sources are the heaters used and the heat of crystallization released during solidification. The latter, for example in the case of a silicon single crystal with a diameter of 300 mm at a pulling speed of 0.4 mm/min, is thereby responsible for about 2 kW of additional heat being produced at the solidification interface.

In addition to the direct radiation and heat conduction, the heat transfer processes produced by the melt flows are also of considerable importance. The dissipation of heat in the region of the solidification interface is crucially determined by the heat which is radiated out and the dissipation of heat by conduction in the single crystal. Overall, therefore, the heat balance can be adjusted by means of the structure of the pulling installation, i.e. the geometric arrangement of the heat-conducting parts, of the heat shields and by means of additional heat sources. However, the process conditions, such as for example growth rate, pressure, quantity, type and guidance of purge gases through the pulling installation also make a considerable contribution to the heat balance. By way of example, a temperature reduction is achieved by increasing the pressure or the quantity of purge gas. Higher pulling speeds increase the heat of crystallization which is generated.

Adjusting the heat-transferring melt flows often proves difficult, since complete theoretical calculation in advance is very complicated. The melt flows are dependent on the magnitude and direction of the rotations of the crucible and of the single crystal. For example, rotation in the same direction results in a completely different convection pattern than rotation in opposite directions. Rotation in opposite directions is generally preferred, leading in relative terms to less oxygen-rich material and being more stable over the pulled length of single crystal. The melt flows can also be influenced by the action of forces from electromagnetic fields which are applied. Static magnetic fields are used for slowing-down purposes, while dynamic fields can deliberately change and increase both the magnitude and the direction of the melt flows.

The radial temperature distribution in the solidification region of the single crystal is substantially determined by the heat which is radiated out at the edge. Therefore, the temperature drop is generally very much greater at the edge of the single crystal than in its center. The axial temperature drop is generally denoted by G (axial temperature gradient). Its radial variation G(r) is a very significant factor in determining the crystal internal point defect distribution and therefore also the further crystal properties. The radial change in the temperature gradient G which results from the heat balance is generally determined from digital simulation calculations. For this purpose, to check the calculations, axial longitudinal sections are taken through the single crystal. The radial profile of the solidification interface is made visible by suitable preparation methods. A solidification interface which is bent significantly upward is generally found. A more shallow form indicates a more homogenous temperature gradient. The radial variation of the temperature gradient can be derived more accurately from the behavior of the radial crystal defect distribution for various growth rates.

With regard to the formation of crystal defects, the ratio $v/G(r)$ is of primordial importance, $G(r)$ representing the axial temperature gradient at the solidification interface of the single crystal as a function of the radial position in the single crystal. The variable v represents the speed at which the single crystal is pulled from the melt. If the ratio $v/G$ is above a critical value $k1$, predominantly vacancy defects occur, which may agglomerate and can then be identified, for example, as COPs (crystal originated particles). Depending on the detection method, they are sometimes also referred to as LPDs (light point defects) or LLS. On account of the generally decreasing radial profile of $v/G$, the COPs are most prevalent in the center of the single crystal. They generally have diameters of approximately 100 nm and may cause problems during component fabrication. The size and number of the COPs are determined from the starting concentration, the cooling rates and the presence of foreign substances during the agglomeration. The presence of nitrogen, for example, causes the size distribution to be shifted toward smaller COPs with a greater defect density.

If the ratio of $v/G$ is below a critical value $k2$, which is lower than $k1$, predominantly silicon internal point defects in the form of interstitials (silicon self-interstitials) appear. These can likewise form agglomerates and manifest themselves on a macroscopic scale as dislocation loops. These are often referred to as A swirl, or the smaller form as B swirl, or as Lpit defects (large etch pits) for short, on account of their appearance. In terms of their size, Lpits are in a range of over 10 μm. In general, even epitaxial layers can no longer cover these defects without any flaws. Consequently, these defects may adversely affect the yield of components.

The range in which neither agglomeration of vacancies nor agglomeration of interstitials takes place, i.e. the range in which $v/G$ is between $k1$ and $k2$, is referred to in the broadest sense as the neutral zone or perfect. However, a further distinction is drawn between a range in which unagglomerated vacancies which are still free are located and a region defined by interstitials. The vacancy range, also known as the v region (vacancies), is distinguished by the fact that, given a sufficiently high oxygen content in the single crystal, oxygen-induced stacking faults are formed there, while the i-range (interstitials) remains completely free of flaws. In the narrower sense, therefore, only the i-region is actually a perfect crystal region.

Large oxygen precipitations with a diameter of over 70 nm can be made visible as oxygen-induced stacking faults (OSFs). For this purpose, the semiconductor wafers which have been cut from the single crystal are prepared by means of a special heat treatment referred to as wet oxidation. The size growth of the oxygen precipitates which have been formed during the crystal growth process and are sometimes also referred to as as-grown BMDs (bulk micro defects), is promoted by the vacancies in the silicon lattice. Therefore, OSFs are found only in the v range.

The single crystal becomes virtually defect free if the growth conditions are successfully set in such a way that the radial profile of the defect function v/G(r) lies within the critical limits of the COP or Lpit formation. However, this is not easy to achieve, in particular if single crystals with a relatively large diameter are being pulled, since the value of G is then significantly dependent on the radius. In this case, the temperature gradient at the edge of the crystal is very much higher than in the center, on account of thermal radiation losses.

The radial profile of the defect function v/G(r) or of the temperature gradient G(r) leads to the possibility of a plurality of defect regions being present on one semiconductor wafer cut from the single crystal. COPs preferentially occur in the center. The size distribution of the agglomerated vacancies results from the cooling rate of the single crystal in the region of the solidification interface. The size distribution of the COPs can be deliberately changed from a small number of large COPs to a large number of small, less disruptive COPs by using a high cooling rate or by doping the melt with nitrogen. The COP region is adjoined by the oxygen-induced stacking fault ring (OSF), as a result of the interactions between silicon vacancies and oxygen precipitations. This is followed on the outer side by a completely defect-free region which in turn is delimited by a region with crystal defects comprising silicon interstitial agglomerates (LPITs). At the edge of the single crystal, the interstitials diffuse out as a function of the thermal conditions, so that a defect-free ring in the centimeter range can once again form at that location.

The crystal defect regions which occur in connection with the radial v/G profile are extensively explained in *Eidenzon/Puzanov in Inorganic Materials*, Vol. 33, No 3, 1997, pp. 219-255. This article also refers to possible ways of producing defect-free material. Reference is made in this context both to the required cooling rates in the agglomeration temperature range, to the influence exerted by means of nitrogen doping and to methods such as the oscillating growth rate. To a certain degree, v/G(r) can be homogenized over the crystal diameter by using passive or active heat shields in the region of the solidification interface, as has been presented, for example, in patent literature EP 866150 B1or U.S. Pat. No. 6,153,008. However, homogenizing the temperature gradient using these methods becomes more and more difficult with large single crystals.

In view of knowledge acquired to date, there is a demand, in particular with regard to crystal diameters of 200 mm and above, to find new economic methods for setting the required growth conditions, so that the defect profile required by the customer is obtained. Semiconductor wafers which include only COPs, in particular those with a predetermined size and density distribution, and semiconductor wafers which do not have any agglomerates of point defects, are of particular interest in this context. However, semiconductor wafers with a stacking fault ring (ring wafers), having both or having just one type of point defect may also be specified by the customer. The requirement is in particular for the growth conditions to be set in such a way that as many semiconductor wafers as possible having the specified defect properties can be separated from the single crystal.

The targeted control of the radial profile of the axial temperature gradient G(r) at the solidification interface and of the growth rate v not only makes it possible to set specific defect distributions in the single crystal. In addition, since the incorporation of oxygen and dopants in the single crystal is likewise highly dependent on the growth limit, targeted control of the temperature gradient also makes it possible to reduce radial variations of dopant and oxygen distributions.

One possible way of controlling this is to use magnetic fields when pulling the single crystal, since magnetic fields can be used to influence the flow conditions in the melt and therefore the temperature balance, in particular in the region of the solidification interface. Descriptions have been given of the use of static magnetic fields (horizontal, vertical and CUSP magnetic fields), single-phase or multiphase alternating fields, rotating magnetic fields and traveling magnetic fields. For example, according to patent applications EP 1225255 A1 and U.S. Pat. No. 2002/0092461 A1, a traveling magnetic field is used to enable the incorporation of oxygen in the single crystal to be controlled.

SUMMARY OF THE INVENTION

It is an object of the present invention to provide an improved process allowing the concentration of internal defects and of foreign substances such as oxygen and dopant in the radial direction to be set in a targeted fashion within a narrow range.

The present invention relates to a process for producing a silicon single crystal by pulling the single crystal using the Czochralski method from a melt which is held in a rotating crucible, wherein a temperature distribution which deviates from rotational symmetry is produced in the melt in the region of a solidification interface.

In the conventional Czochralski method, symmetrical physical conditions are maintained, i.e. the melt flows and the temperature distribution follow the rotationally symmetrical arrangement during pulling of the crystal.

The inventors of the process described below have discovered that a targeted disruption to the rotational symmetry of the temperature field in the melt, in particular in the region of the solidification interface, has the effect of making the axial temperature gradient G(r) and the concentration of oxygen and dopants more uniform over the crystal diameter. This effect also manifests itself, for example, in the fact that the curvature of the solidification interface is significantly reduced compared to when a rotationally symmetrical temperature field is used.

According to the invention, this fact is exploited to produce single crystals whose concentration of defects, oxygen and dopants in the radial direction are within a narrow tolerance range. It is possible for these concentrations to be set deliberately taking account of the v/G relationship.

Therefore, the invention also relates to a silicon single crystal which, over an ingot length of over 10 per cent of the total ingot length, has a uniform defect picture and narrow radial dopant and oxygen variations. Particularly preferred embodiments are (I) a single crystal which, over an ingot length of over 10 percent of the total ingot length, is free of agglomerated internal point defects over 60 percent of the cross-sectional area or more; (II) a single crystal which, over an ingot length of over 10 percent of the total ingot length, includes only agglomerated vacancies; and (III) a single crystal which, over an ingot length of over 10 percent of the total ingot length, includes only agglomerated interstitials. Furthermore, the single crystals preferably have a diameter of at least 200 mm and preferably have radial dopant variations of less than 10% over an ingot length of over 10 percent of the total ingot length and radial oxygen variations of less than 10% over an ingot length of over 10 percent of the total ingot length.

According to a particularly preferred embodiment of the process, a magnetic field which has been applied to the melt, preferably a traveling magnetic field, is partially shielded, so that the rotational symmetry of the field lines with respect to the axis of rotation of the crucible is broken. In particular the shape and material of the shield used, the amplitude and frequency of the magnetic field and the crucible rotation have an effect on the temperature distribution in the region of the solidification interface.

Metallic materials, such as for example copper plates with a thickness of one or a few centimeters, which are arranged inside the magnet coils, can be used as magnetic shields. The depth of penetration of dynamic magnetic fields is dependent on the frequency used. Therefore, frequencies of 10 Hz to approximately 1000 Hz are used. When using traveling magnetic fields with partial shielding in the form of rectangular copper plates, a frequency in the region of 30 Hz is particularly suitable. The strength of the magnetic field also determines its effect. Current intensities of preferably up to 500 A in the case of up to 50 coil turns are used to generate alternating fields. High crucible rotational speeds, in particular rotations of 3 rpm and above, reduce the influence of the magnetic field, i.e. the desired non-rotationally symmetrical effect on the melt flows then decreases significantly. The quantity of melt which is in each case present in the crucible should also be taken into account, since different melt flow patterns can form as a function of this quantity. The required conditions, i.e. the ratio of magnetic field, shielding and pulling process parameters, such as for example the crucible rotation, are in each case determined in more detail by experiments and by simulation calculations for estimation purposes.

According to a further embodiment of the process, the single crystal is pulled extra-axially, in other words when the single crystal is being pulled the axes of rotation of single crystal and crucible are not congruent. This leads to similar advantageous results in particular with regard to the reduction in the radial variations in the concentrations of foreign substances or dopants. However, in this embodiment the possibilities of controllable intervention in the pulling process are limited. In individual tests, it was possible to improve the radial variation in particular in the oxygen content by up to one percent.

BRIEF DESCRIPTION OF THE DRAWINGS

Other objects and features of the present invention will become apparent from the following detailed description considered in connection with the accompanying drawings. It should be understood, however, that the drawings are designed for the purpose of illustration only and not as a definition of the limits of the invention.

In the drawing, wherein similar reference characters denote similar elements throughout the several views.

DETAILED DESCRIPTION OF PREFERRED EMBODIMENTS

Figure 1:
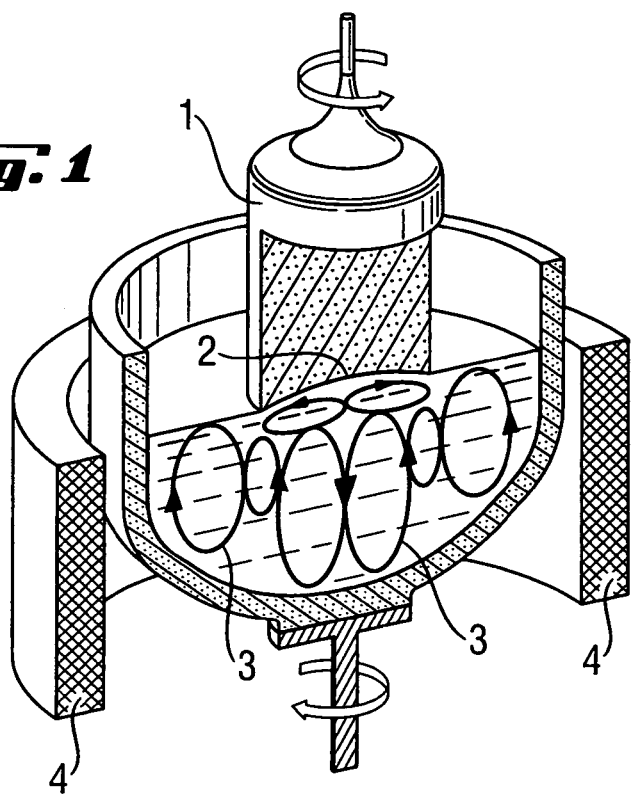
FIG. 1 diagrammatically depicts the conventional crystal pulling process.
Figure 2:
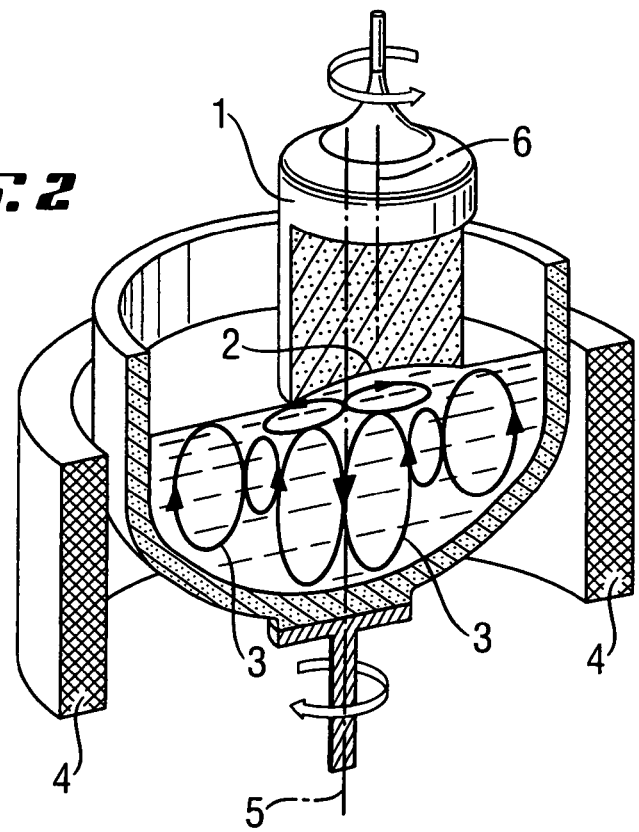
FIG. 2 illustrates the arrangement for extra-axial crystal pulling in accordance with the second embodiment of the process.

FIG. 1 diagrammatically depicts the conventional crystal pulling process. It shows the arrangement of single crystal 1, solidification interface 2, crucible, melt flows 3 and crucible heating 4. By contrast, FIG. 2 shows an arrangement for extra-axial crystal pulling in accordance with the second embodiment of the process according to the invention, indicated by the different position of crucible axis of rotation 5 and crystal axis of rotation 6. Distances between the axes of rotation of over one centimeter already lead to noticeably changed conditions, which are no longer rotationally symmetrical, at the solidification interface.

Figure 3:
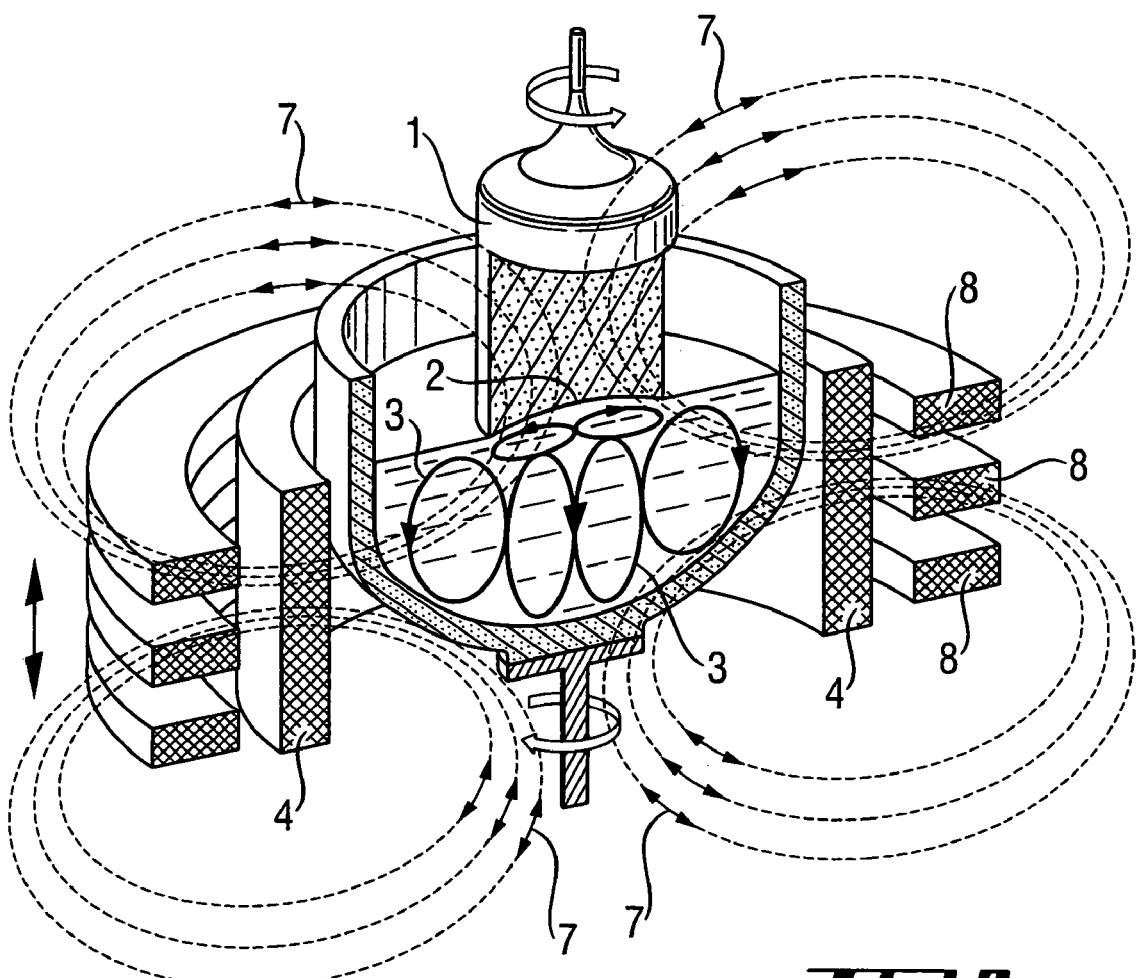
FIG. 3 shows a rotationally symmetrical arrangement which is typical of the prior art and in which a traveling magnetic field is used.

The following figures explain the invention on the basis of the example of a traveling magnetic field being applied. The melt flows, which are in each case illustrated diagrammatically, result from accompanying simulation calculations. FIG. 3 shows a rotationally symmetrical arrangement which is typical of the prior art and uses a traveling magnetic field, also referred to as a TMF, on account of the action of forces on the melt flows, comprising a single crystal 1, a solidification interface 2 and a heater 4. The effect of the traveling magnetic field, which is generated by magnet coils 8 and is illustrated by magnetic field lines 7, manifests itself in the melt flows 3 which result. The arrangement shown in FIG. 3, with a single crystal 1 pulled axially from a crucible, crucible heater 4 and magnetic means 8 positioned concentrically with respect to the single crystal and the crucible, generates a conventionally used melt flow 3 and is typical of the processes described in the prior art. The diagrammatically depicted magnetic coils 8 have up to 50 turns and can carry electric currents of up to 500 A with a coil diameter of over 500 mm.

Figure 4:
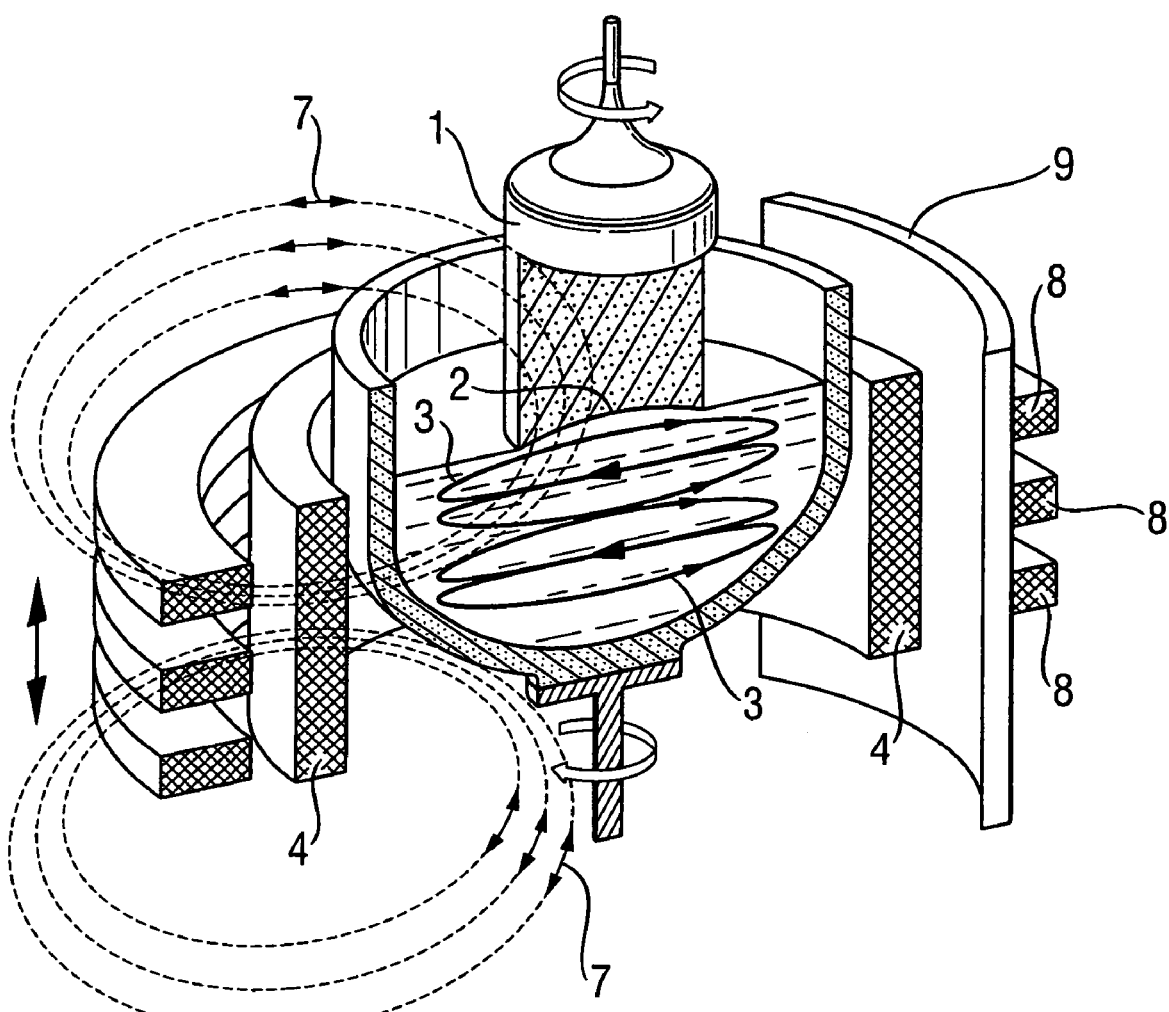
FIG. 4 shows an arrangement having an additional magnetic shield which breaks the rotationally symmetrical conditions.
Figure 5:
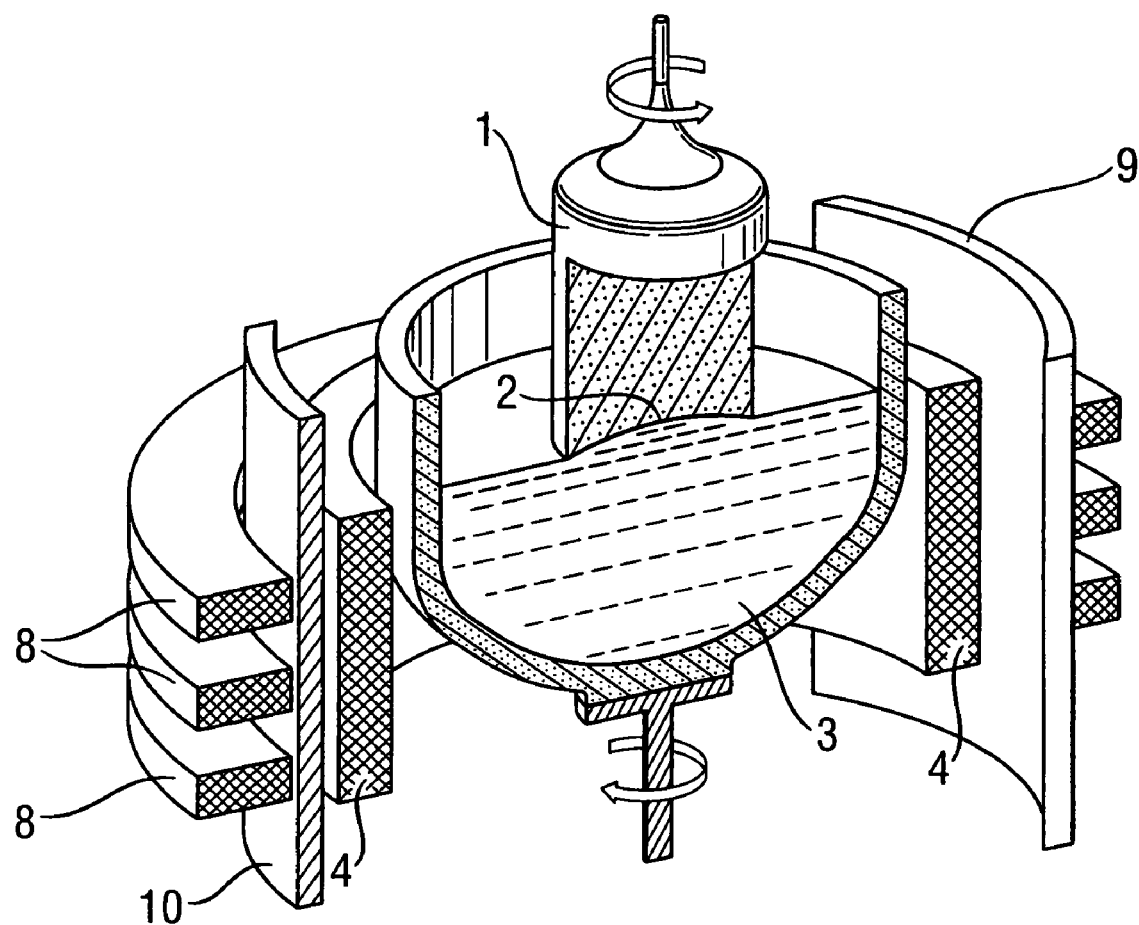
FIG. 5 shows a preferred arrangement with two split magnetic shields.

FIG. 4 represents an arrangement for carrying out the preferred embodiment of the process and therefore, compared to the arrangement shown in FIG. 3, additionally includes a magnetic shield 9 which breaks up the rotationally symmetrical conditions. Completely changed heat-transferring melt flows 3 are established, leading, for example, to significant flattening of the solidification interface 2 and allowing the temperature gradient G(r) to be homogenized in the radial direction. The metallic shield used causes the rotational symmetry of the magnetic field 5 acting on the melt and the single crystal to be lost, resulting in an asymmetric traveling magnetic field (ATMF), which produces the melt flow 3 which deviates from rotational symmetry. Simulation calculations indicate that two or more shields which in total shield up to ⅔ of the magnet coil area facing the single crystal and are arranged symmetrically with respect to the axis of rotation generate even more favorable melt flows. As a result, excellent homogenization of the temperature gradient G(r) at the solidification interface is to be expected. FIG. 5 illustrates a particularly preferred embodiment with two-split magnetic fields 9 and 10 which are arranged between the means 8 which-generate the magnetic field and the crucible.

EXAMPLES

The text which follows uses examples to explain the effect of arrangements according to the invention by comparison with conventional arrangements in more detail.

Figure 6:
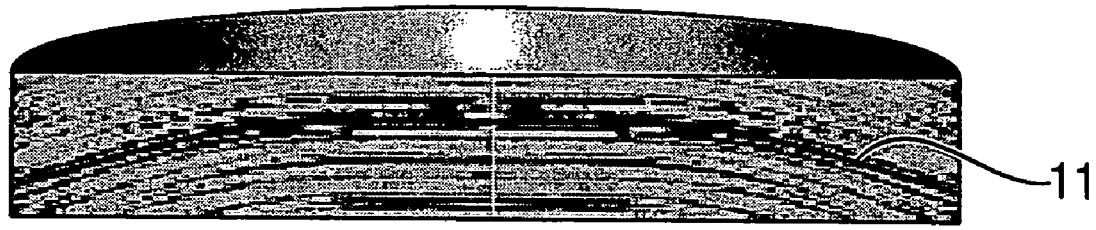
FIG. 6 shows an axial longitudinal section through a single crystal which has been pulled under conventional conditions using a rotationally symmetrical traveling magnetic field, corresponding to the arrangement illustrated in FIG. 3.
Figure 7:
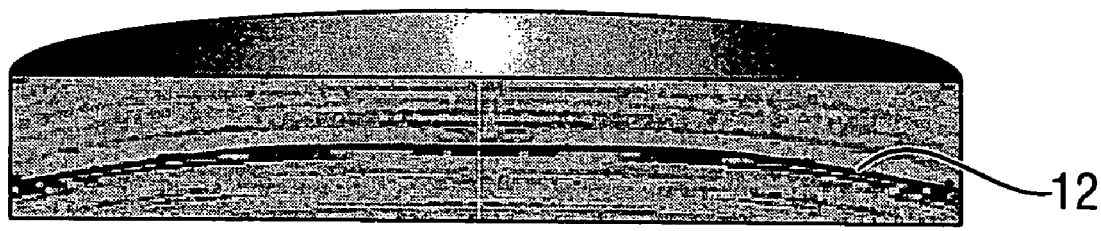
FIG. 7 shows a lifetime measurement which clearly reveals the effect of partially shielding a traveling magnetic field.

FIG. 6 shows an axial longitudinal section through a single crystal which has been pulled under conventional conditions using a rotationally symmetrical traveling magnetic field, corresponding to the arrangement illustrated in FIG. 3. The strongly curved radial profile of the solidification interface 11 can be seen very clearly from lifetime measurements (μPCD) as illustrated in longitudinal section. For comparison purposes, FIG. 7 presents a lifetime measurement which clearly reveals the effect of partially shielding a traveling magnetic field. During production of the crystal, an arrangement with an asymmetric traveling field (ATMF), as diagrammatically illustrated in FIG. 4, was used, with otherwise identical crystal pulling conditions. Compared to FIG. 6, the lifetime measured on a longitudinal section through the single crystal has a greatly reduced curvature of the solidification interface. The flatter solidification interface, as made clear by the emphasized curve 12, makes it possible to infer that the axial temperature gradient G(r) is more uniform in the region of the solidification interface.

Figure 8:
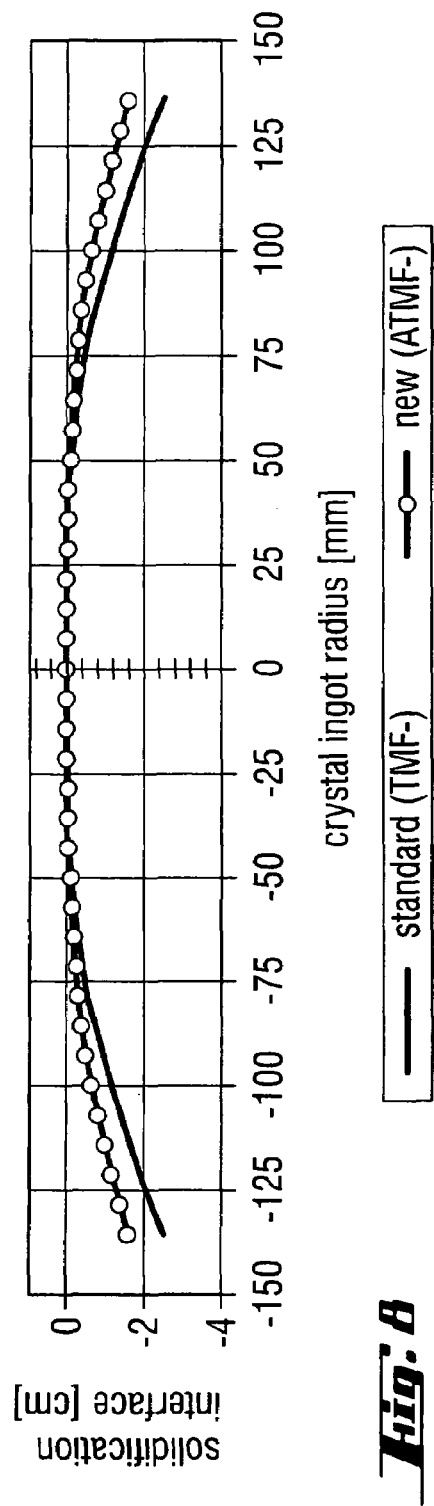
FIG. 8 shows the results of a plurality of lifetime measurements in order to compare the various curvature profiles of the solidification interface of a symmetrical traveling field (TMF) and an asymmetrical traveling field (ATMF)

FIG. 8 summarizes the results of a plurality of lifetime measurements in order to compare the various curvature profiles of the solidification interface of a symmetrical traveling field (TMF) and an asymmetrical traveling field (ATMF) in the arrangement which have been diagrammatically illustrated in FIG. 3 and FIG. 4, respectively.

Figure 9:
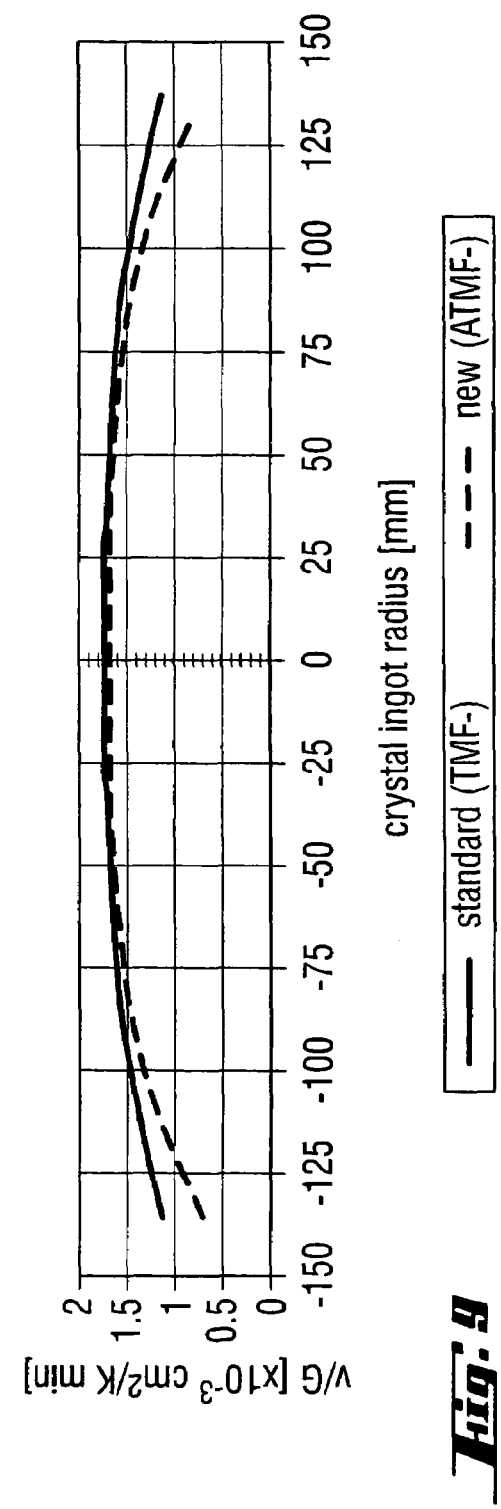
FIG. 9 shows simulation calculations which were used to estimate the radial profile of the axial temperature gradient.
Figure 10:
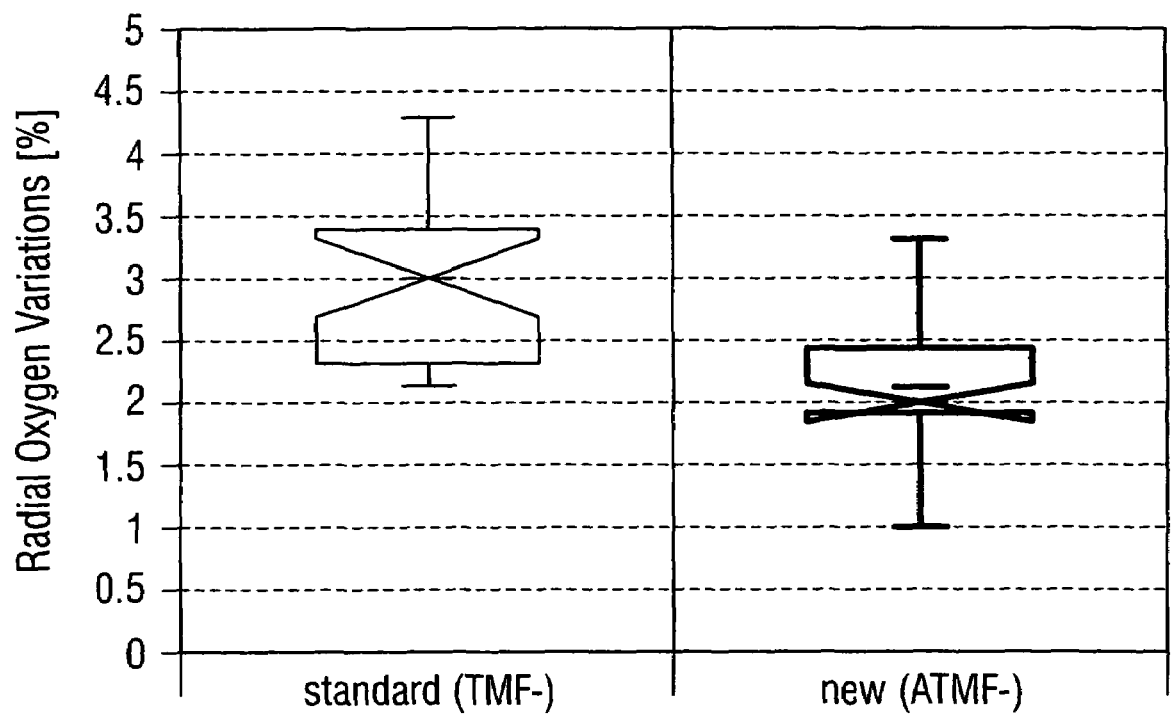
FIG. 10 shows a statistical comparison of radial oxygen variations in single crystals pulled under a symmetrical traveling field (TMF) and an asymmetrical traveling field (ATMF).

Simulation calculations were used to estimate the radial profile of the axial temperature gradient illustrated in FIG. 9 on the basis of the test results. By analogy to the flatter solidification interface, homogenization of the temperature gradient and therefore of v/G(r) is to be expected. The flatter solidification interface also makes its presence felt in the radial distribution of the foreign substances, in particular the oxygen concentration. The statistical comparison of radial oxygen variations in FIG. 10 in single crystals pulled under a symmetrical traveling field (TMF) and an asymmetrical traveling field (ATMF) indicates a more uniform incorporation of the oxygen over the diameter of the single crystal when using an arrangement in accordance with the invention.

Accordingly, while a few embodiments of the present invention have been shown and described, it is to be understood that many changes and modifications may be made thereunto without departing from the spirit and scope of the invention as defined in the appended claims.

What is claimed is:

1. A process for producing a silicon single crystal comprising:
    pulling the silicon single crystal using a Czochralski method from a melt which is held in a rotating crucible; and
    producing a temperature distribution which deviates from rotational symmetry in the melt in a region of a solidification interface during said step of pulling by applying a partially shielded traveling magnetic field.

2. The process of claim 1,
    wherein asymmetry of the temperature distribution is effected by applying a partially shielded traveling magnetic field wherein the magnetic field comprises two opposed magnetic fields, the magnetic fields of each being substantially parallel to a longitudinal axis of the silicon single crystal above and below a crystal growth interface.

3. The process of claim 2,
    wherein the partially shielded traveling magnetic field is used to control melt flows in order to make an axial temperature gradient more uniform over the crystal diameter.

4. The process of claim 2,
    wherein the asymmetry of the temperature distribution is influenced by an amplitude of the traveling magnetic field.

5. The process of claim 2,
    wherein the asymmetry of the temperature distribution is influenced by a frequency of the traveling magnetic field.

6. The process of claim 2,
    wherein the asymmetry of the temperature distribution is influenced by shape and materials properties of a shield.

7. The process of claim 2,
    wherein the asymmetry of the temperature distribution is influenced by rotation of the crucible.

8. The process of claim 1,
    wherein a curvature of a solidification interface is reduced.

9. The process of claim 1,
    wherein an axial temperature gradient is made more uniform at the solidification interface.

10. The process of claim 1, wherein one or more copper plates positioned between a crucible heater and an electromagnetic device partially shield the melt from a rotationally symmetrical magnetic field.

11. The process of claim 1, further comprising recovering a single crystal silicon ingot having a radial profile of solidification interface which is less curved than an otherwise similar silicon single crystal produced with a rotationally symmetrical magnetic field.

12. The process of claim 1, wherein a rotationally asymmetric magnetic field causes a difference in the edge growth region of the solidification interface and the axial growth region of the solidification interface to decrease relative to the difference in the respective growth rates in the presence of a rotationally symmetrical magnetic field.

13. A process for producing a silicon single crystal comprising:
    pulling the silicon single crystal using a Czochralski method from a melt which is held in a rotating crucible; and producing a temperature distribution which deviates from rotational symmetry in the melt in a region of a solidification interface during said step of pulling, wherein said deviation from rotational symmetry is produced by exposing the melt to a traveling magnetic field which is rotationally symmetrical with respect to a crucible rotation axis while rotating the single silicon crystal about a crystal rotation axis which differs from a crucible rotation axis of the rotating crucible.

14. The process of claim 13, wherein an asymmetry of the temperature distribution is effected by extra-axial pulling of the silicon single crystal.

15. The process of claim 13, wherein extra-axial pulling of the silicon single crystal makes an axial temperature gradient more uniform over the crystal diameter.

16. An apparatus for pulling a silicon single crystal using the Czochralski method, comprising
a rotatable crucible with a melt held in the crucible;
a heating device;
an electromagnet device which generates a traveling magnetic field;
both said heating device and said electromagnet device positioned circumferentially around an exterior of the crucible;
and at least one shield which causes the symmetry of the magnetic field generated by the electromagnet device to be asymmetric with respect to a rotational axis of the crucible.

17. The apparatus of claim 16, wherein said shield constitutes a copper plate positioned around only a portion of a periphery of the crucible.

18. The apparatus of claim 16, wherein a plurality of copper plates are positioned circumferentially around the crucible between said heating device and said electromagnetic device.

19. The apparatus of claim 16, wherein said electromagnetic device is radially symmetrical about a rotational axis of said rotating crucible.

20. The apparatus of claim 16, wherein the traveling magnetic field has a frequency of about 10 hz and the rotating crucible rotates at a rate of less than 3 rpm.

* * * * *